(12) United States Patent
Liu et al.

(10) Patent No.: US 7,380,585 B2
(45) Date of Patent: Jun. 3, 2008

(54) LOOP-TYPE HEAT EXCHANGE MODULE

(75) Inventors: Tay-Jian Liu, Guangdong (CN);
Chao-Nien Tung, Guangdong (CN);
Chuen-Shu Hou, Guangdong (CN);
Chih-Hao Yang, Guangdong (CN)

(73) Assignee: Foxconn Technology Co., Ltd.,
Tu-Cheng, Taipei Hsien (TW)

( * ) Notice: Subject to any disclaimer, the term of this patent is extended or adjusted under 35 U.S.C. 154(b) by 183 days.

(21) Appl. No.: 11/306,358

(22) Filed: Dec. 25, 2005

(65) Prior Publication Data
US 2007/0006992 A1 Jan. 11, 2007

(30) Foreign Application Priority Data
Jul. 8, 2005 (CN) .................. 2005 1 0035917 A

(51) Int. Cl.
*F28D 15/02* (2006.01)
(52) U.S. Cl. .................. 165/104.33; 165/122
(58) Field of Classification Search ........... 165/122, 165/104.21, 104.26, 104.33; 361/697, 700; 257/715
See application file for complete search history.

(56) References Cited
U.S. PATENT DOCUMENTS
6,137,681 A * 10/2000 Lu .................. 361/697
6,166,907 A * 12/2000 Chien .................. 361/699
6,328,097 B1 * 12/2001 Bookhardt et al. ..... 165/104.33
6,421,239 B1 * 7/2002 Huang .................. 361/696
6,567,269 B2 * 5/2003 Homer et al. .......... 361/700
6,900,990 B2 * 5/2005 Tomioka .................. 361/752
2003/0000684 A1 * 1/2003 Huang et al. .......... 165/104.33
2003/0051859 A1 * 3/2003 Chesser et al. ........ 165/104.26

* cited by examiner

*Primary Examiner*—Teresa J Walberg
(74) *Attorney, Agent, or Firm*—Winston Hsu

(57) ABSTRACT

A loop-type heat exchange module (10) is disclosed, which includes an evaporator (11), a vapor conduit (12), a condenser (13), a liquid conduit (14), a cooling fan (16), a fastening seat (151) and a fan cover (152). The evaporator contains therein a working fluid. The working fluid evaporates into vapor after absorbing heat in the evaporator, and the generated vapor flows, via the vapor conduit, to the condenser where the vapor releases the heat and is condensed into condensate. The condensate then returns back, via the liquid conduit, to the evaporator to thereby form a heat transfer loop. The cooling fan is applied to produce a forced airflow towards the condenser. The fastening seat is used for fastening the evaporator to have an intimate contact with a heat-generating electronic component. The fan cover extends from one side of the fastening seat and receives the cooling fan and the condenser therein.

19 Claims, 11 Drawing Sheets

LOOP-TYPE HEAT EXCHANGE MODULE

FIELD OF THE INVENTION

The present invention relates generally to an apparatus for transfer or dissipation of heat from heat-generating components, and more particularly to a loop-type heat exchange module suitable for removing heat from electronic components.

Description of Related Art

As progress continues to be made in electronic industries, electronic components such as integrated circuit chips are produced to have more powerful functions while maintaining a unchanged size or even a smaller size. As a result, the amount of heat generated by these electronic components during their normal operations is commensurately increased, which in turn will adversely affect their workability and stability. Therefore, thermal solutions are required to maintain these electronic components within an acceptable temperature range.

It is well known that cooling devices are commonly used to remove heat from heat-generating components. However, currently well-known cooling devices such as extruded heat sink plus cooling fan are no longer qualified or desirable for removing the heat from these electronic components due to their low heat removal capacity. Conventionally, increasing the rotation speed of the cooling fan and increasing the size of the heat sink are two approaches commonly used to improve the heat dissipating performance of the cooling device involved. However, if the rotation speed of the cooling fan is increased, problems such as large noise will inevitably be raised. On the other hand, by increasing the size of the heat sink, it will make the cooling device bulky, which contravenes the current trend towards miniaturization and makes the cooling device unsuitable for use in electronic products having a limited mounting space such as notebook computers.

Therefore, it is desirable to provide a high-efficiency cooling device which overcomes the foregoing disadvantages.

SUMMARY OF INVENTION

The present invention relates to a loop-type heat exchange module for removing heat from a heat-generating component. The heat exchange module includes an evaporator, a condenser, a vapor conduit, a liquid conduit, a cooling fan, a fastening seat and a fan cover. The evaporator contains therein a working fluid. The working fluid is capable of turning into vapor in the evaporator upon receiving the heat from the heat-generating component. Each of the vapor and liquid conduits is connected between the evaporator and the condenser. The vapor generated in the evaporator is capable of being transferred via the vapor conduit to the condenser and turning into condensate in the condenser upon releasing the heat carried by the vapor. The condensate is capable of being transferred via the liquid conduit to the evaporator, thus forming a heat transfer loop. The cooling fan is applied to produce a forced airflow towards the condenser. The fastening seat is attached to the evaporator. The fan cover receives the cooling fan and the condenser therein.

In the present heat exchange module, the heat coming from the heat-generated component is capable of being effectively removed by the working fluid along the heat transfer loop when continuously undergoing phase transitions from liquid to vapor and then from vapor to liquid (condensate). Further, main parts of the heat exchange module including the evaporator, the condenser, the fastening seat and the fan cover are easily to be configured to have small sizes and are easily to be modulized together, thus making the present heat exchange module suitable for use in electronic products having therein a limited mounting space.

Other advantages and novel features of the present invention will become more apparent from the following detailed description of preferred embodiment when taken in conjunction with the accompanying drawings, in which:

DETAILED DESCRIPTION

Figure 1:
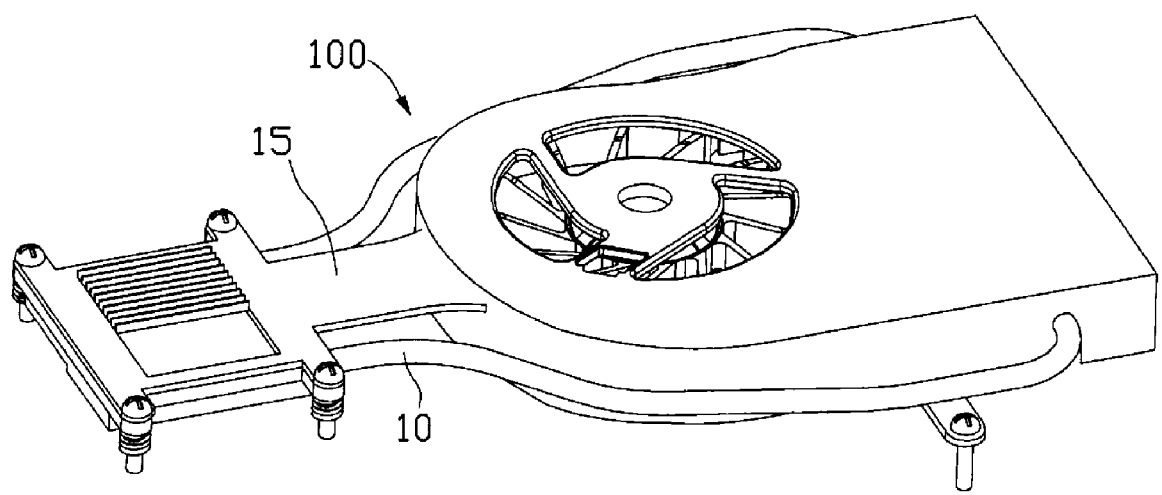
FIG. 1 is an isometric view of a loop-type heat exchange module in accordance with a first embodiment of the present invention.
Figure 2:
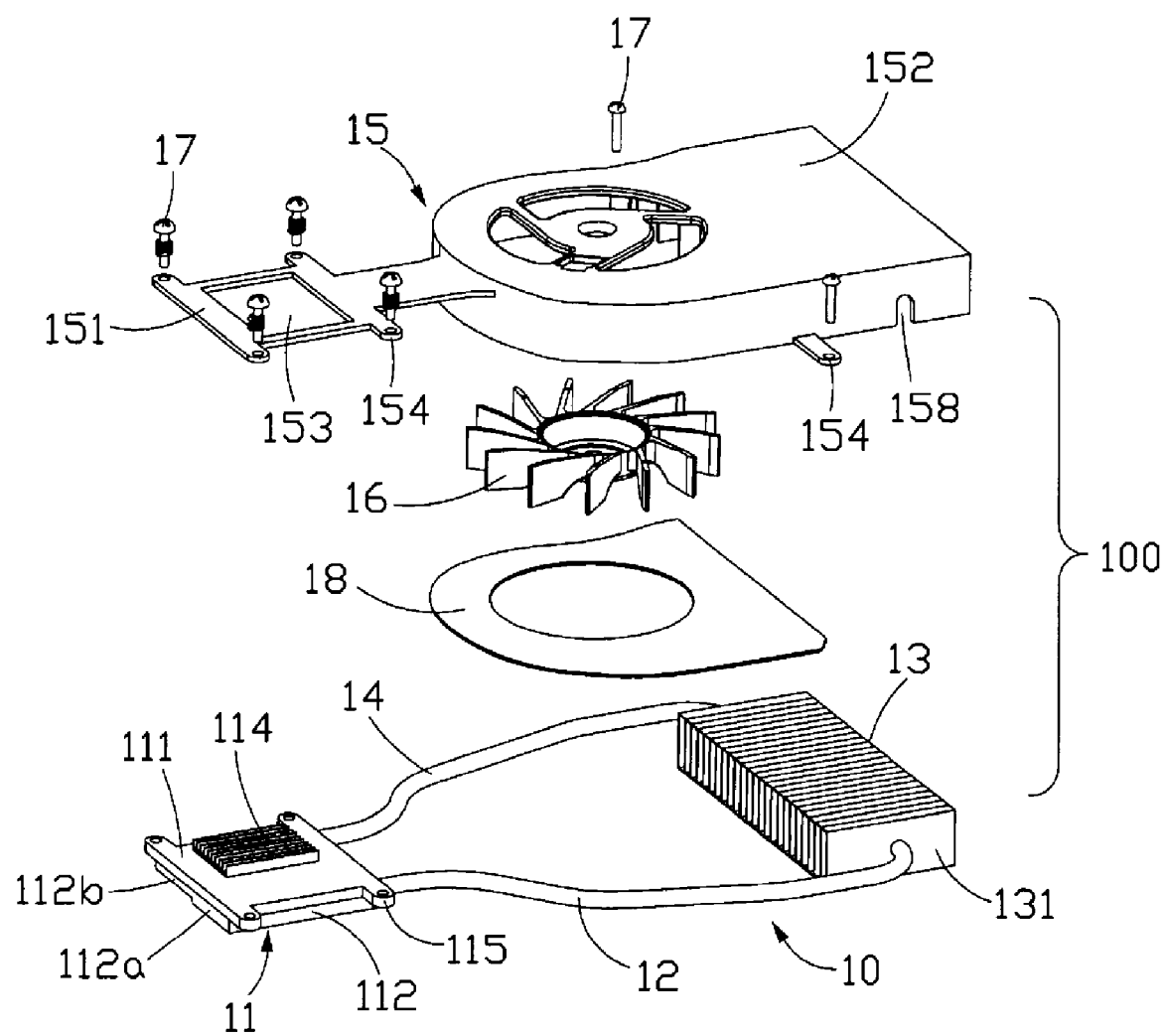
FIG. 2 is an exploded, isometric view of the heat exchange module of FIG. 1.
Figure 3:
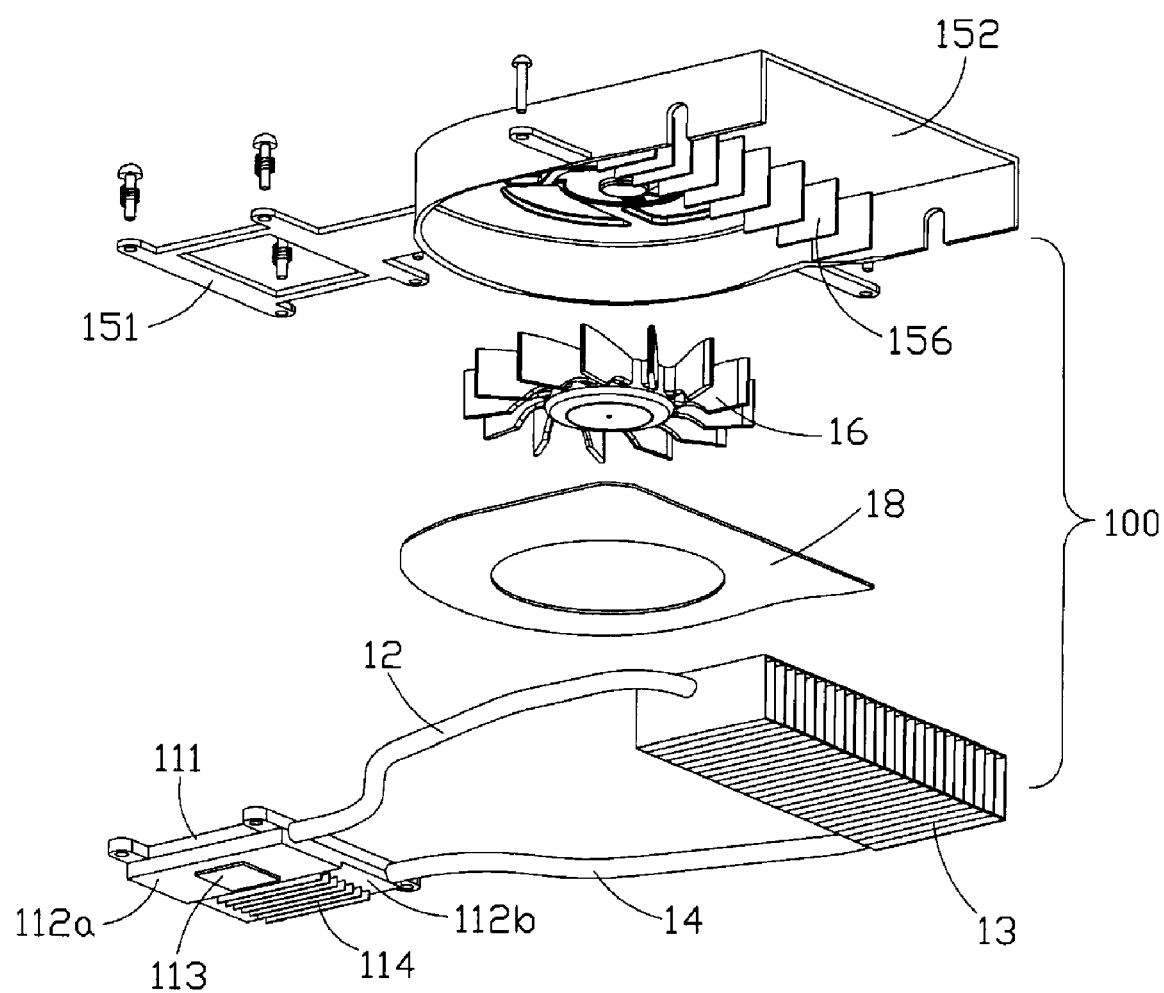
FIG. 3 is an exploded, isometric view of the heat exchange module of FIG. 1, but viewed from a bottom aspect.

FIGS. 1-3 illustrate a loop-type heat exchange module 100 in accordance with a first embodiment of the present invention. The heat exchange module 100 includes a loop-type heat pipe assembly 10 and a clamping mechanism 15 attached to the heat pipe assembly 10. The heat pipe assembly 10 includes an evaporator 11, a vapor conduit 12, a condenser 13 and a liquid conduit 14. Two ends of each of the vapor and liquid conduits 12, 14 are respectively connected to the evaporator 11 and the condenser 13. The vapor and liquid conduits 12, 14 preferably are made of flexible metal or non-metal materials so that they could be bent or flattened easily in order to cause the heat exchange module 100 to be applicable in electronic products having a limited mounting space such as notebook computers. The condenser 13 includes a plurality of spaced cooling fins 131 stacked along a pipe section (not labeled) interconnecting the vapor and liquid conduits 12, 14.

The evaporator 11 contains therein a working fluid (not shown). As heat from a heat-generating component (not shown) is applied to the evaporator 11, the working fluid contained in the evaporator 11 evaporates into vapor after absorbing the heat. Then, the generated vapor flows, via the vapor conduit 12, to the condenser 13 where the vapor releases its latent heat of evaporation and is thus condensed into condensate. The condensate then returns back from the condenser 13, via the liquid conduit 14, to the evaporator 11 where it is again available for evaporation, thus forming a heat transfer loop. In order to increase the heat exchange rate of the condenser 13, a cooling fan 16 is provided adjacent to the condenser 13 for producing a forced airflow towards the cooling fins 131 of the condenser 13. In the heat pipe assembly 10, the movements of the vapor and the condensate are carried out respectively and separately in the vapor conduit 12 and the liquid conduit 14 and do not interfere with each other.

As shown in FIGS. 2-3, the evaporator 11 of the heat pipe assembly 10 has a plate-type configuration, which includes a top cover 111 and a bottom cover 112. The top and bottom covers 111, 112 cooperate with each other to define a chamber (not labeled) inside the evaporator 11. The top cover 111 has four first ears 115 respectively extending from four corners thereof. The bottom cover 112 includes a first, thicker section 112a and a second, thinner section 112b extending from the first section 112a. The first section 112a is projected downwardly to an extent below the second section 112b with a step (not labeled) formed therebetween. As particularly shown in FIG. 3, a protrusion 113 is formed by further extending downwardly from a middle portion of the first section 112a of the bottom cover 112 for contacting the heat-generating component.

Figure 4:
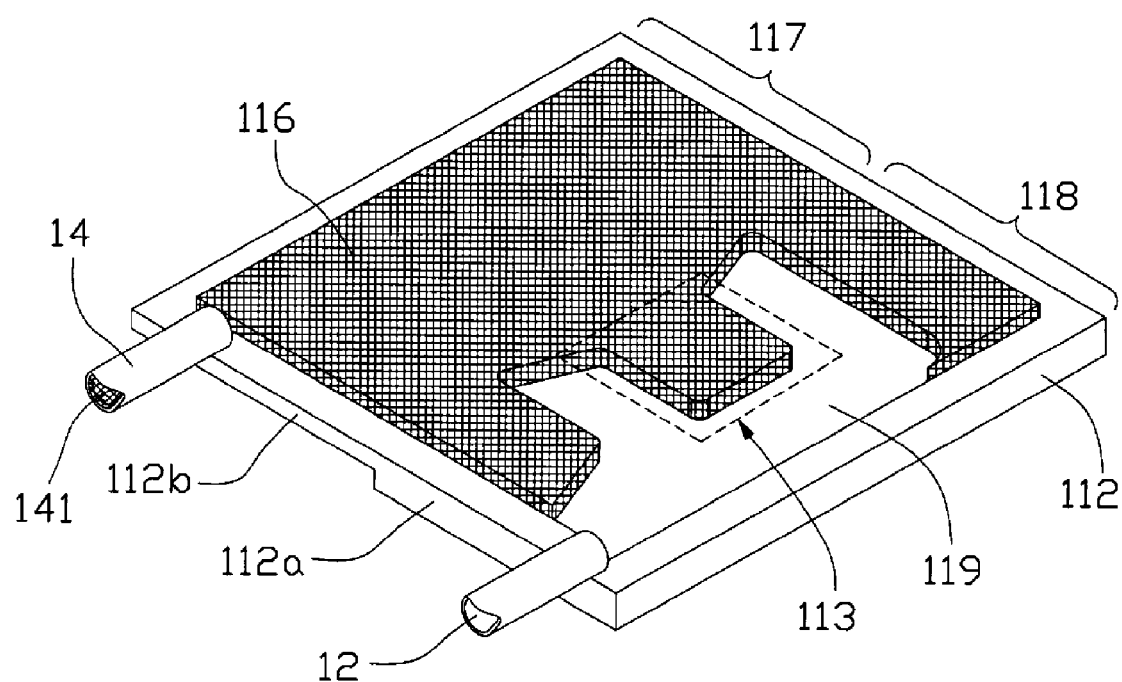
FIG. 4 is an isometric view of an evaporator of the heat exchange module of FIG. 1, with a top cover thereof being removed.

With reference also to FIG. 4, a first wick structure 116 is arranged inside the evaporator 11. The first wick structure 116 defines therein a plurality of micro-channels (not labeled) for storage of and providing passageways for the working fluid contained in the evaporator 11. The first wick structure 116 is preferably in the form of sintered powder or a screen mesh made of metal wires or organic fibers woven together. The working fluid is usually selected from liquids such as water or alcohol. Corresponding to the first and second sections 112a, 112b of the bottom cover 112 of the evaporator 11, an interior of the chamber of the evaporator 11 is divided into two major regions, i.e., a liquid micro-channel region 117 and an adjacent evaporating region 118. The micro-channel region 117 is fully filled with the first wick structure 116. A portion of the first wick structure 116 extends from the micro-channel region 117 into a middle part of the evaporating region 118. This portion of the first wick structure 116 has a size substantially equal to that of the protrusion 113 of the bottom cover 112, and is fittingly located just above that protrusion 113. Additionally, another portion of the first wick structure 116 also extends from the micro-channel region 117 into the evaporating region 118 from two opposite front and rear sides of the evaporating region 118 as viewed from FIG. 4. As a result, the first wick structure 116 spans across both the micro-channel region 117 and the evaporating region 118. The vapor and liquid conduits 12, 14 are connected to the evaporating region 118 and the micro-channel region 117, respectively. The remaining part of the evaporating region 118 not filled with the first wick structure 116 functions as a vapor-gathering section 119 for accommodating the generated vapor in the evaporator 11. This vapor-gathering section 119 is communicated with the vapor conduit 12 so as to enable the generated vapor to leave the evaporator 11 and go into the vapor conduit 12. Additionally, corresponding to the micro-channel region 117, each of the top and bottom covers 111, 112 of the evaporator 11 has a plurality of metal fins 114 extending from an outer surface thereof, as particularly shown in FIGS. 2-3.

Preferably, a second wick structure 141 is arranged against an inner surface of the liquid conduit 14 in order to bring the condensate resulting from the vapor back from the condenser 13 to the evaporator 11 timely, as shown in FIG. 4. The second wick structure 141 may be fine grooves integrally formed at the inner surface of the liquid conduit 14, screen mesh or bundles of fiber inserted into the liquid conduit 14, or sintered powder combined to the inner surface of the liquid conduit 14 by a sintering process. Thus, the condensate in the condenser 13 is capable of being timely sent back to the evaporator 11 under a capillary force developed cooperatively by the first and second wick structures 116, 141, thereby effectively avoiding a potential dry-out problem occurring at the evaporator 11.

As shown in FIGS. 2-3, the clamping mechanism 15 includes a fastening seat 151 and a fan cover 152 integrally extending from one side of the fastening seat 151. The fastening seat 151 has a plate-type configuration with an opening 153 defined in a center thereof for extension of the metal fins 114 formed on the top cover 111 of the evaporator 11 therein. A plurality of second ears 154 extends from the clamping mechanism 15 for extension of fastening means therein. The fastening means is, for example, a plurality of screws 17 in order to secure the heat exchange module 100 to the heat-generating component, wherein these second ears 154 include four second ears 154 extending from four corners of the fastening seat 151 and two second ears 154 extending from two opposites of the fan cover 152. The screws 17 extend through the second ears 154 of the fastening seat 151 and the first ears 115 of the evaporator 11 to secure with a substrate (not shown), for example, a printed circuit board on which the heat-generating component is mounted, whereby the protrusion 113 of the evaporator 11 can intimately engage with the heat-generating component. The screws 17 extend in the second ears 154 of the fan cover 152 are directed secured to the substrate. The fan cover 152 defines a pair of cutouts 158 in opposite sidewalls thereof for respectively accommodating the vapor and liquid conduits 12, 14 when the clamping mechanism 15 is attached to the heat pipe assembly 10. The fan cover 152 has an inverted U-shaped cross-section and defines therein a receiving space (not labeled) for receiving the cooling fan 16 and the condenser 13. A plurality of parallel guiding plates 156 extends downwardly from a bottom surface of an upper plate (not labeled) of the fan cover 152, as particularly shown in FIG. 3. These guiding plates 156 are located between the cooling fan 16 and the condenser 13 as the cooling fan 16 and the condenser 13 are combined to the fan cover 152 so that the forced airflow generated by the cooling fan 16 is guidable evenly towards the cooling fins 131 of the condenser 13 for enhancing a cooling effect of the condenser 13. Typically, a chassis 18 is provided below the cooling fan 16 for mounting the cooling fan 16 onto the fan cover 152. Although it is not shown in the drawings, it is well known by those skilled in the art that specific structures should be provided either in the fan cover 152 or in the chassis 18 to secure the cooling fan in place.

In operation, the clamping mechanism 15, together with the cooling fan 16 mounted thereto, is attached to the loop-type heat pipe assembly 10 with the vapor and liquid conduits 12, 14 located outside the fan cover 152. Then, the clamping mechanism 15 in combination with the heat pipe assembly 10 is mounted to substrate on which the heat-generating component is mounted. Particularly, the four screws 17 are caused to sequentially extend the four second ears 154 of the fastening seat 151 and the four first ears 115 of the evaporator 11 and finally to engage with the substrate, to thereby maintain the protrusion 113 of the evaporator 11 into thermal contact with the heat-generating component. Preferably, a layer of thermal interface material is applied over their contacting surfaces in order to reduce the thermal resistance between the protrusion 113 and the heat-generating component. The heat generated by the heat-generating component is firstly transferred to the first section 112a of the bottom cover 112 and then to the evaporating region 118 of the chamber of the evaporator 11 to cause the working fluid contained in that region to evaporate into the vapor after absorbing the heat from the heat-generating component. Since the micro-channel region 117 is filled with the first wick structure 116, which is saturated with the working fluid in liquid form, the generated vapor will certainly enter into the vapor-gathering section 119 of the evaporating region 118. Thereafter, due to the difference of vapor pressure between the evaporator 11 and the condenser 13, the vapor accordingly goes into the vapor conduit 12 and moves towards the condenser 13. After the vapor releases its latent heat in the condenser 13 and turns into the condensate, the condensate is then rapidly drawn back to the micro-channel region 117 of the chamber of the evaporator 11 via the liquid conduit 14 due to the capillary forces of the first and second wick structures 116, 141. Since an inventory of working fluid in the evaporating region 118 is reduced due to the evaporation in that region, the condensate returned to the micro-channel region 117 is subsequently drawn to the evaporating region 118 for being available again for evaporation, thus forming the heat transfer loop for continuously removing the heat generated by the heat-generating component. In the present heat exchange module 100, the working fluid takes the heat away from the heat-generating component in a unidirectional circulation along the heat transfer loop, when continuously undergoing phase transitions from liquid to vapor and then from vapor to liquid (condensate). Since heat pipes are an effective heat transfer means due to their low thermal resistance, the present heat exchange module 100 incorporating the loop-type heat pipe assembly 10 is thus capable of effectively removing the heat from the heat-generating component.

In order to reduce an amount of vapor to be formed and accumulated in the micro-channel region 117, it is preferred to prevent the condensate returned to the micro-channel region 117 from being heated and evaporated into vapor in that region, since the thus generated vapor will accumulate in that region and accordingly produce a large resistance to the flow of the condensate flowing towards the evaporating region 118. If the condensate is not timely sent to the evaporating region 118 due to the resistance of the vapor accumulated in the micro-channel region 117, a dry-out problem will be raised in the evaporating region 118. In the present heat exchange module 100, the heat coming from the heat-generating component is directly transferred to the first, thicker section 112a of the bottom cover 112. The two-section design of the bottom cover 112 with different thicknesses is aimed to reduce an amount of the heat from the heat-generating component to be conducted from the first, thicker section 112a to the second, thinner section 112b and finally to the micro-channel region 117 of the evaporator 11. Since the first section 112a has a larger thickness than the second section 112b, the heat conducted laterally from the first, thicker section 112a towards the second section 112b is thus effectively reduced. As a result, the heat transferred from the second section 112b to the corresponding micro-channel region 117 of the evaporator 11 is also effectively reduced. Thus, excessive vapor is prevented from being formed and accumulated in the micro-channel region 117. The condensate returned to the micro-channel region 117 of the evaporator 11 is accordingly capable of being timely supplied to the evaporating region 118 for evaporation.

Since the micro-channel region 117 is connected with the adjacent evaporating region 118, a portion of the vapor generated in the evaporating region 118 will "creep" from the evaporating region 118 into the micro-channel region 117 due to a large vapor pressure in the vapor-gathering section 119. That is, a specific amount of the vapor generated in the evaporating region 118 will gradually move towards and enter into the micro-channel region 117 due to the large vapor pressure. In addition, the temperature in the micro-channel region 117 will also gradually increase, subject to a relatively high temperature and the flow of vapor in the evaporating region 118. Thus, in order to further reduce the amount of vapor accumulated in the micro-channel region 117, it is also preferred to lower the temperature in that region. In the present heat exchange module 100, the metal fins 114 formed on the top and bottom covers 111, 112 of the evaporator 11 corresponding to the micro-channel region 117 are used to facilitate heat dissipation of the micro-channel region 117 of the evaporator 11, thereby condensing that portion of vapor creeping into the micro-channel region 117 into condensate at that region and meanwhile to maintain a relatively low temperature for the micro-channel region 117. In practice, the metal fins 114 preferably have a low height and are integrally formed with the top and bottom covers 111, 112 so as to minimize the size of the evaporator 11.

In the present heat exchange module 100, the heat coming from the heat-generated component is effectively removed by the heat pipe assembly 10 along the established heat transfer loop. Furthermore, main parts of the heat exchange module 100 including the evaporator 11, the condenser 13, the cooling fan 16, the vapor and liquid conduits 12, 14 and the clamping mechanism 15 are configured to have a plate-shaped configuration and are modulized together. Thus, the heat exchange module 100 is suitable for use in an electronic product having a limited mounting space (particularly a limited height) and can be easily mounted to, or dismounted from, a heat-generated component of the electronic product by only addressing these screws 17.

Figure 5:
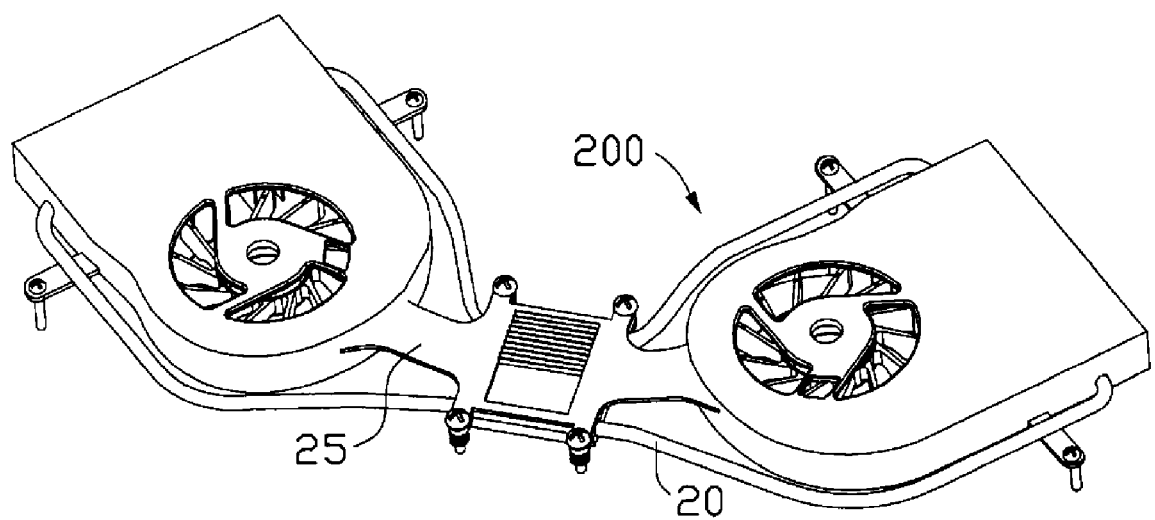
FIG. 5 is an isometric view of a loop-type heat exchange module in accordance with a second embodiment of the present invention.
Figure 6:
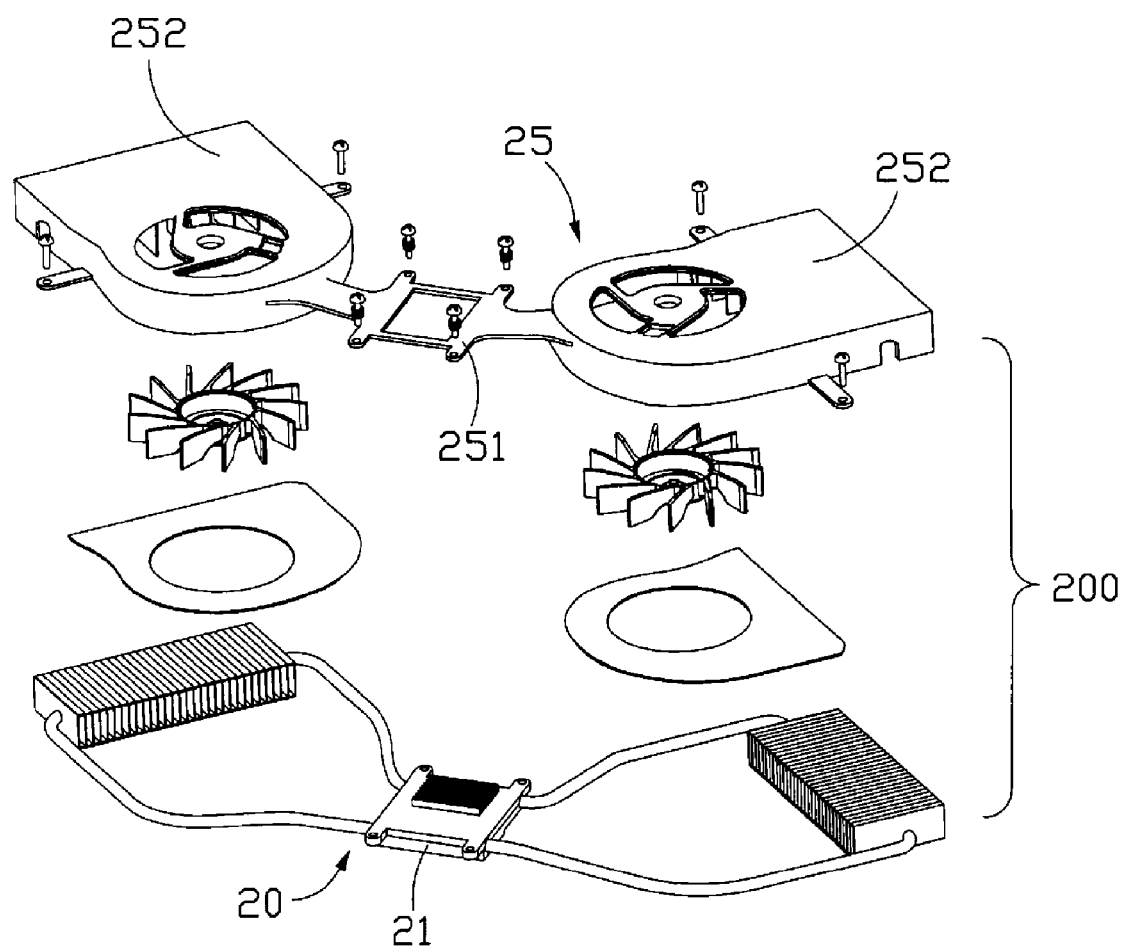
FIG. 6 is an exploded, isometric view of the heat exchange module of FIG. 5.

FIGS. 5-6 show a loop-type heat exchange module 200 in accordance with a second embodiment of the present invention. In this embodiment, the evaporator 21 of the loop-type heat pipe assembly 20 is connected with two heat transfer loops in order to increase its heat removal capacity. Correspondingly, the clamping mechanism 25 of the heat exchange module 200 has a central fastening seat 251 and two fan covers 252 extending from two opposite sides of the central fastening seat 251. This heat exchange module 200 is applicable for removing heat from heat-generating components with a high cooling requirement.

Figure 7:
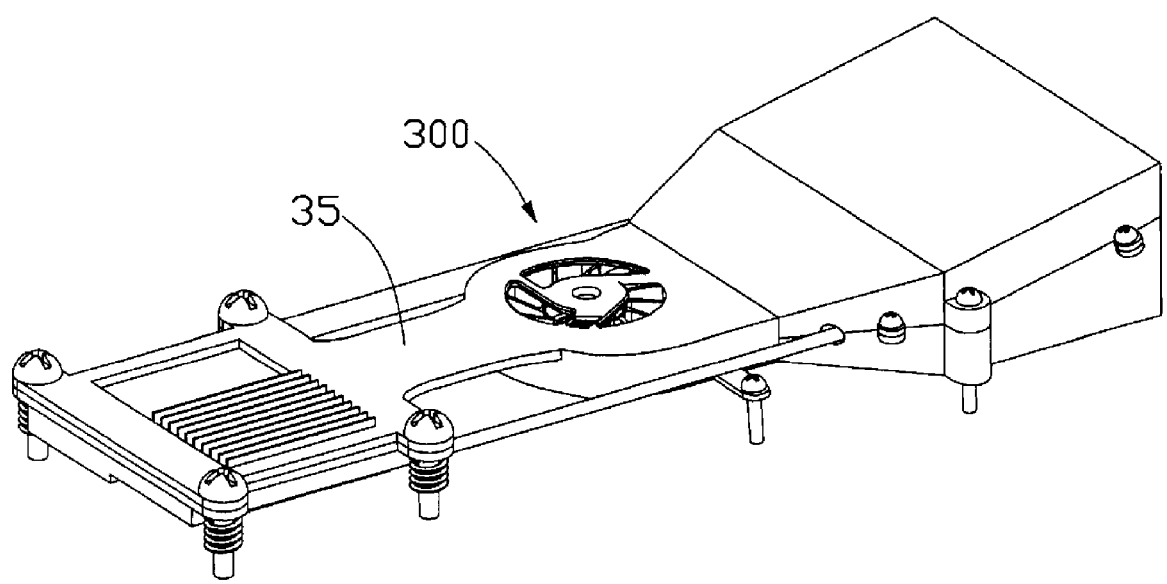
FIG. 7 is an isometric view of a loop-type heat exchange module in accordance with a third embodiment of the present invention.
Figure 8:
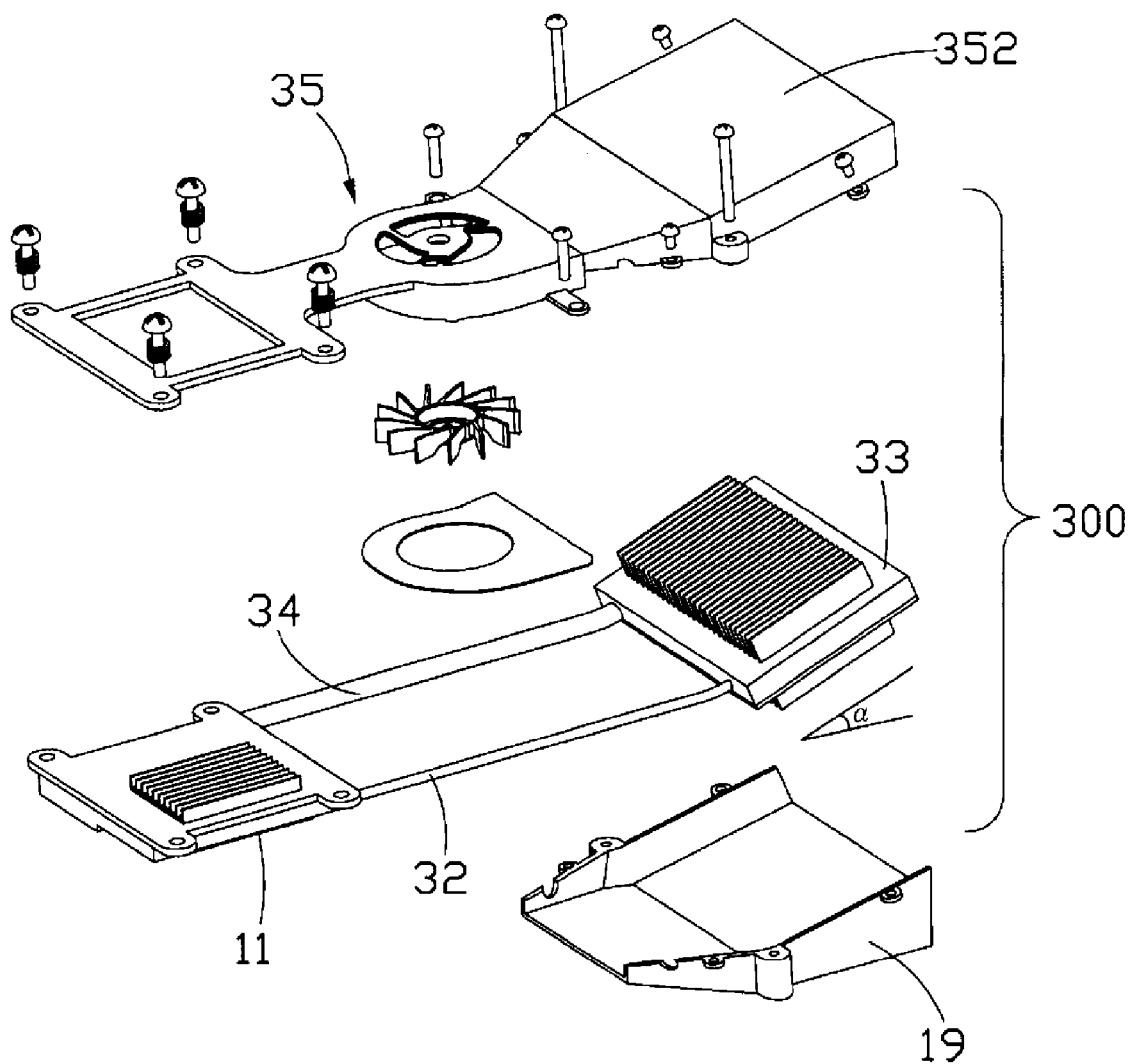
FIG. 8 is an exploded, isometric view of the heat exchange module of FIG. 7.
Figure 9:
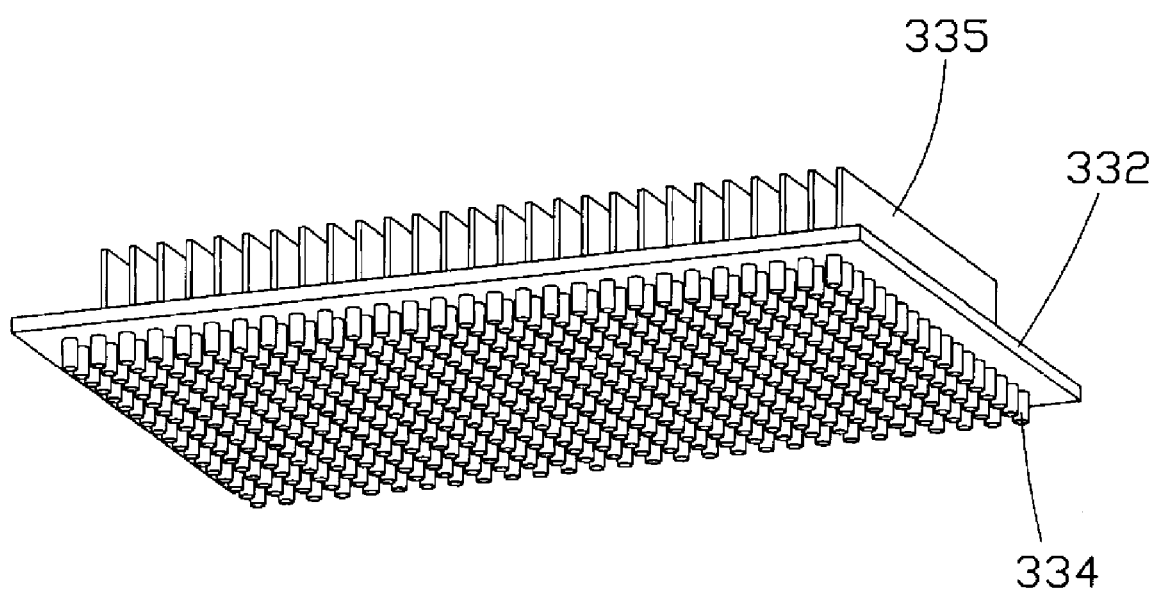
FIG. 9 is an isometric view of a bottom plate of a condenser of the heat exchange device of FIG. 8 in an upside-down manner.
Figure 10:
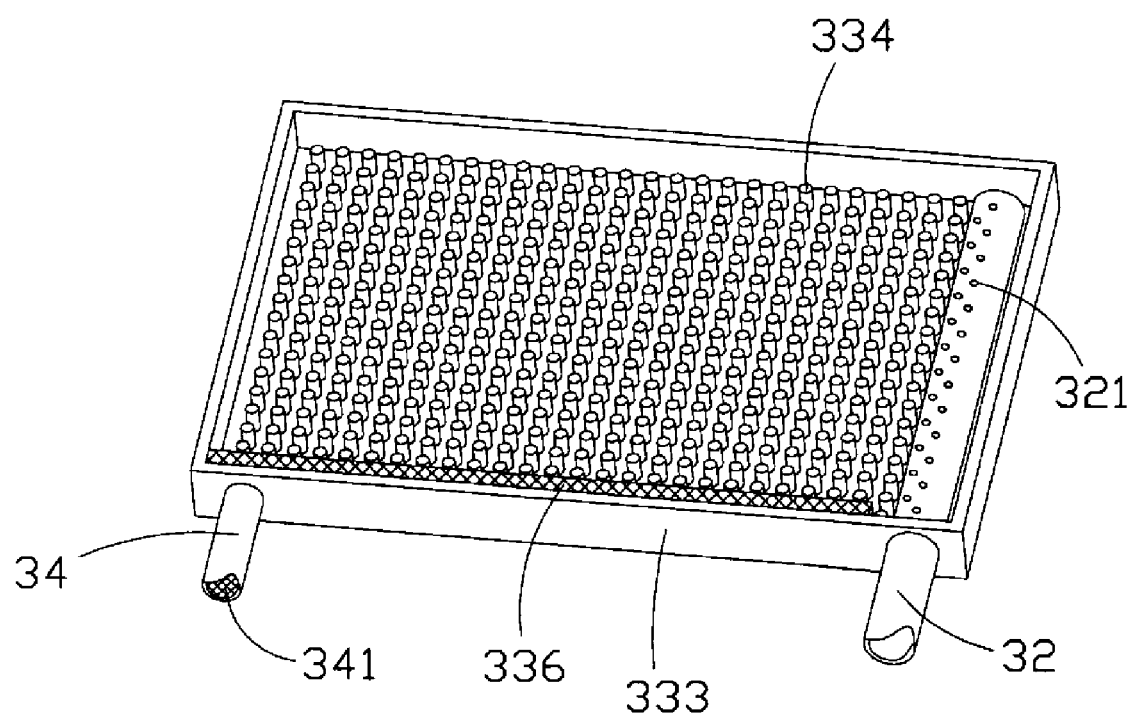
FIG. 10 is an isometric view of a top cover of the condenser of the heat exchange device of FIG. 8 in an upside-down manner.

FIGS. 7-8 show a loop-type heat exchange module 300 in accordance with a third embodiment of the present invention. In this embodiment, the vapor conduit 32 has a larger diameter than the liquid conduit 34 so as to reduce a resistance to the movement of the vapor and enable the vapor to move towards the condenser 33 effectively and smoothly. With reference also to FIGS. 9-10, the condenser 33 has a two-piece structure, which includes a bottom plate 332 and a top enclosure 333. The bottom plate 332 and the top enclosure 333 cooperate with each other to define a chamber (not labeled) inside the condenser 33. A plurality of plate-type cooling fins 335 extends from an outer surface of each of the bottom plate 332 and the top enclosure 333 for increasing the heat-dissipation surface area of the condenser 33. In addition, a plurality of heat-exchange pins 334 extends from an inner surface of each of the bottom plate 332 and the top enclosure 333 towards the chamber of the condenser 33 so as to increase the heat-absorbing surface area of the condenser 33 and exchange heat more efficiently with the vapor guided into the condenser 33. These heat-exchange pins 334 may be metal pin-fins or miniaturized heat-pipes. The heat-exchange pins 334 may be integrally formed with the bottom plate 332 and the top enclosure 333. The heat-exchange pins 334 formed in the condenser 33 function as a cooling-enhancing structure to enhance the heat exchange capability of the condenser 33. Specifically, the vapor entering into the condenser 33 is directly and rapidly heat-exchanged with these heat-exchange pins 334. The heat-exchange pins 334 then transfer the heat received from the vapor to the outer cooling fins 335 for further dissipation.

In order to bring the condensate in the condenser 33 back to the evaporator 11 timely, a third wick structure 336 is provided inside the condenser 33, lining a sidewall thereof to which the vapor and liquid conduits 32, 34 are commonly connected, as shown in FIG. 10. This third wick structure 336 preferably is in the form of sintered powder or a screen mesh made of metal wires or organic fibers woven together. This third wick structure 336 covers an inlet (not labeled) of the liquid conduit 34 and therefore connects with the wick structure 341 provided in the liquid conduit 34. After the vapor entering into the condenser 33 releases its latent heat and turns into the condensate, the condensate is firstly absorbed by the third wick structure 336 due to its capillary force, and then is further brought back the evaporator 11 under the capillary forces developed by the wick structures 341, 116 respectively provided in the liquid conduit 34 and the evaporator 11. Thus, the condensate in the condenser 33 is capable of being timely sent back to the evaporator 11 in a continuous manner, thereby preventing an excessive amount of the condensate from being accumulated in the condenser 33 and accordingly avoiding the potential dry-out problem occurring at the evaporator 11.

Figure 11:
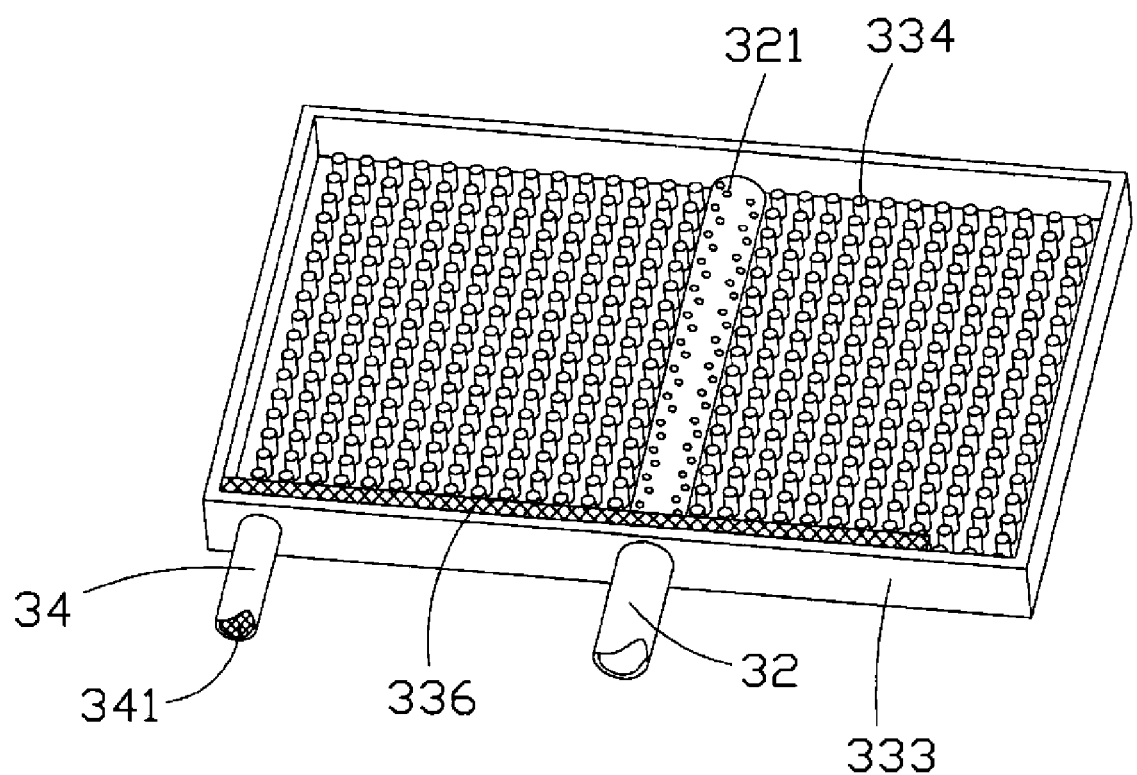
FIG. 11 is a view similar to FIG. 10, showing a top cover of the condenser of the heat exchange device of FIG. 8, in accordance with another embodiment.

As particularly shown in FIGS. 10-11, a distal end portion of the vapor conduit 32 extends deep into an interior of the condenser 33, and a plurality of openings 321 is defined in that distal end portion. These openings 321 are distributed over a circumferential periphery of the distal end portion and function as a vapor dispenser for distributing the vapor guided by the vapor conduit 32 evenly towards the heat-exchange pins 334 of the condenser 33. As shown in FIG. 10, the vapor conduit 32 is inserted into the condenser 33 from one side thereof, and the openings 321 are oriented towards an opposite side of the condenser 33. As shown in FIG. 11, the vapor conduit 32 is inserted into the condenser 33 from a middle thereof, and the openings 321 are distributed over two opposite sides of the distal end portion of the vapor conduit 32 facing two groups of the heat-exchange pins 334 divided by the vapor conduit 32.

Furthermore, in this heat exchange module 300, the condenser 33 is disposed aslant with respect to the liquid conduit 34, with an acute angle (α) formed therebetween, as shown in FIG. 8. Thus, the condenser 33 is located at a level higher than that of the evaporator 11, whereby the condensate in the condenser 33 is capable of entering into the liquid conduit 34 and the evaporator 11 more easily due to an additional driving force, i.e., the gravity of the condensate. Correspondingly, the clamping mechanism 35 of the heat exchange module 300 includes an inclined fan cover 352 for receiving the condenser 33 in cooperation with a lower cover 19.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat exchange module comprising:
    an evaporator containing therein a working fluid, the working fluid being capable of turning into vapor in the evaporator upon receiving heat;
    a condenser;
    a vapor conduit and a liquid conduit each being connected between the evaporator and the condenser, wherein the vapor generated in the evaporator is capable of being transferred via the vapor conduit to the condenser and turning into condensate in the condenser upon releasing the heat, and the condensate is capable of being transferred via the liquid conduit to the evaporator;
    a cooling fan for producing a forced airflow towards the condenser;
    a fastening seat located above and attached to the evaporator, the fastening seat exerting a downward force on the evaporator for fastening the evaporator to have a thermal connection with a heat-generating electronic component; and
    a fan cover receiving the cooling fan and the condenser thereunder, the fan cover extending from one side of the fastening seat and being integrally formed with the fastening seat as a single piece.

2. The heat exchange module of claim 1, wherein the evaporator and the fastening seat each have a plate-type configuration.

3. The heat exchange module of claim 1, wherein the condenser includes a plurality of metal fins, the fan cover has a plurality of guiding plates formed thereon and the guiding plates are located between the cooling fan and the metal fins of the condenser for guiding the forced airflow of the cooling fan to the metal fins of the condenser.

4. The heat exchange module of claim 1, wherein the vapor conduit and the liquid conduit are flexible, and the evaporator, the vapor conduit, the condenser, the liquid conduit are connected in series to form a loop structure.

5. The heat exchange module of claim 1, wherein a wick structure is arranged inside the liquid conduit.

6. The heat exchange module of claim 1, wherein the evaporator defines therein a chamber, the chamber is divided into two regions and a wick structure is arranged inside the evaporator spanning across the two regions of the chamber.

7. The heat exchange module of claim 6, wherein one region of the chamber is fully filled with the wick structure and functions as a micro-channel region for receiving the condensate coming from the condenser, and the other region of the chamber is partially filled with the wick structure and functions as an evaporating region for evaporation of the working fluid inside the evaporator.

8. The heat exchange module of claim 7, wherein the evaporator includes a plurality of cooling fins thermally connected to an outer surface thereof and located at a position corresponding to the micro-channel region of said chamber.

9. The heat exchange module of claim 7, wherein the evaporator includes a top cover and a bottom cover cooperating with each other to define said chamber, and the bottom cover has a section being thicker than a remaining part of the bottom cover, said section corresponding to the evaporating region of said chamber.

10. The heat exchange module of claim 1, wherein the condenser defines therein a chamber, and a plurality of heat-exchange pins extends into the chamber for exchanging heat with the vapor transferred to the condenser.

11. The heat exchange module of claim 10, wherein a distal end portion of the vapor conduit extends into the chamber of the condenser and the distal end portion of the vapor conduit defines therein a vapor dispenser, the vapor dispenser including a plurality of openings.

12. The heat exchange module of claim 1, further comprising another condenser, another vapor conduit and another liquid conduit, the another vapor conduit and the another liquid conduit each being connected between said another condenser and said evaporator.

13. A heat exchange module for removing heat from a heat-generating component comprising:

a loop-type heat pipe assembly including an evaporator and a condenser, the evaporator containing therein a working fluid and being adapted for engaging with the heat-generating component, the working fluid being capable of turning into vapor upon receiving the heat at the evaporator and the vapor being capable of turning into condensate upon releasing the heat at the condenser;

a cooling fan for producing a forced airflow towards the condenser;

a fastening seat located above and attached to the evaporator;

a fan cover extending from the fastening seat and receiving the cooling fan and the condenser thereunder; and fastening means engaging with the fastening seat for securing the evaporator into thermal contact with the heat-generating component.

14. The heat exchange module of claim 13, wherein said fastening means includes a plurality of screws.

15. The heat exchange module of claim 13, wherein the condenser is located at a level which is higher than that of the evaporator.

16. The heat exchange module of claim 15, wherein the condenser is oriented inclinedly relative to a liquid conduit interconnecting the condenser and the evaporator.

17. The heat exchange module of claim 13, wherein the evaporator accommodates a first wick structure therein and a liquid conduit interconnecting the condenser and the evaporator accommodates a second wick structure therein, the first wick structure connecting with the second wick structure.

18. The heat exchange module of claim 13, wherein the evaporator has a bottom wall with a thicker section and a thinner section, the thicker section being adapted for contacting with the heat-generating component.

19. The heat exchange module of claim 18, wherein the evaporator has heat-dissipating fins thereon at a position corresponding to said thinner section of the bottom wall.

* * * * *